United States Patent
Luu et al.

(10) Patent No.: US 6,294,955 B1
(45) Date of Patent: Sep. 25, 2001

(54) APPARATUS AND METHOD FOR USE IN DISCONNECTING AND/OR REPLACING ONE OF A PLURALITY OF POWER AMPLIFIERS IN A TRANSMITTER WHILE THE TRANSMITTER IS OPERATING

(75) Inventors: Ky Thoai Luu, Mason; David Roger Koontz, Maineville, both of OH (US)

(73) Assignee: Harris Corporation, Melbourne, FL (US)

( * ) Notice: Subject to any disclaimer, the term of this patent is extended or adjusted under 35 U.S.C. 154(b) by 0 days.

(21) Appl. No.: 09/544,736

(22) Filed: Apr. 7, 2000

(51) Int. Cl.[7] ............................... H03F 1/14; H03F 3/68; H03F 1/00
(52) U.S. Cl. .................. 330/51; 330/124 D; 330/124 R; 330/165
(58) Field of Search ................................ 330/51, 124 D, 330/124 R, 165

(56) References Cited

U.S. PATENT DOCUMENTS

| | | | |
|---|---|---|---|
| 4,580,111 | 4/1986 | Swanson | 332/41 |
| 4,780,685 | * 10/1988 | Ferguson | 330/124 D |
| 4,949,050 | 8/1990 | Swanson | 330/298 |
| 5,570,062 | * 10/1996 | Dent | 330/51 |
| 5,930,128 | * 7/1999 | Dent | 330/124 R |

* cited by examiner

Primary Examiner—Robert Pascal
Assistant Examiner—Patricia T. Nguyen
(74) Attorney, Agent, or Firm—Tarolli, Sundheim, Covell, Tummino & Szabo L.L.P.

(57) ABSTRACT

Apparatus and method are presented for use in disconnecting and/or replacing one of a plurality of M power amplifier modules in an RF transmitter while the transmitter is operating. Each amplifier module has first and second outputs that normally are connected across an associated one of M transformer primary windings. Also, M transformer secondary windings are provided with each associated with one of the primary windings. The secondary windings are connected together in series across a load. Each amplifier module has a control input for receiving a disable signal that disables the amplifier module. The apparatus for use in disconnecting and/or replacing includes a switch having a disable condition and an enable condition. A controller responds to the switch being in a disable condition for providing a disable signal. A shorting switch is provided having a normal open condition and a shorting condition and wherein the switch is connectable across the primary winding of an associated amplifier module to be disconnected and/or replaced. A shorting switch driver responds to the disable signal for driving the shorting switch to its shorting condition to short circuit the primary winding associated with the amplifier module that is to be disconnected and/or replaced.

9 Claims, 3 Drawing Sheets

APPARATUS AND METHOD FOR USE IN DISCONNECTING AND/OR REPLACING ONE OF A PLURALITY OF POWER AMPLIFIERS IN A TRANSMITTER WHILE THE TRANSMITTER IS OPERATING

BACKGROUND OF THE INVENTION

1. Technical Field

This invention relates to the art of radio broadcasting and, more particularly, to disconnecting and/or replacing one of a plurality of power amplifiers in a transmitter while the transmitter is operating.

2. Description of the Prior Art

The U.S. Pat. Nos. to H. I. Swanson 4,580,111 and 4,949,050 disclose an amplitude modulator for use in AM radio broadcasting and wherein the modulator serves to generate an amplitude modulated signal by selectively turning on and off a plurality of RF amplifiers in a digital manner to produce amplitude modulation. Each of the RF amplifiers provides an output voltage across the primary winding of a transformer. The secondary windings are connected together in a series circuit in a series combiner. Output current flows in the secondary windings to supply a load, such as an antenna for broadcasting an RF signal.

Frequently, such amplifiers are referred to as amplifier modules and such modules may be arranged side-by-side or stacked vertically. The modules are removably mounted in a cabinet so that each module may be removed for servicing or replacement. Before removal, the amplifier module is shut off but should not be removed until no current is flowing in the secondary windings. Normally, this requires that the transmitter be shut down. If such an amplifier module is turned off and an attempt is made to remove the amplifier from the series combiner, an open circuit will take place across the primary winding associated with the removed amplifier module. If the transmitter is still operating a high voltage potential will be developed across the open circuit of the primary winding and this will cause damage to the transformer and other associated circuitry. Consequently, the removal of such an amplifier module cannot take place while the transmitter is operating. The transmitter must be turned off before removing the amplifier module for repair. This creates discontinuity in the operation of the transmitter system.

SUMMARY OF THE INVENTION

In accordance with the present invention, apparatus and method are provided for use in disconnecting and/or replacing one of a plurality of M power amplifier modules in an RF transmitter while the transmitter is operating. Each amplifier module has first and second outputs that normally are connected across an associated one of M transformer primary windings. Also, M transformer secondary windings are provided with each associated with one of the primary windings. The secondary windings are connected together in series across a load. Each amplifier module has a control input for receiving a disable signal that disables the amplifier module. The apparatus for use in disconnecting and/or replacing includes a switch having a disable condition and an enable condition. A controller responds to the switch being in a disable condition for providing a disable signal. A shorting switch is provided having a normal open condition and a shorting condition and wherein the switch is connectable across the primary winding of an associated amplifier module to be disconnected and/or replaced. A shorting switch driver responds to the disable signal for driving the shorting switch to its shorting condition to short circuit the primary winding associated with the amplifier module that is to be disconnected and/or replaced.

BRIEF DESCRIPTION OF THE DRAWINGS

The foregoing and other objects and advantages of the present invention will become more readily apparent from the following description as taken in conjunction with the accompanying drawings, wherein.

DESCRIPTION OF THE PREFERRED EMBODIMENT

One application of the present invention is in conjunction with RF power amplifiers employed in an AM broadcast transmitter. An example of such a transmitter is presented in FIG. 1 and takes the form of a digital amplitude modulator such as that illustrated and described in the aforesaid U.S. Pat. No. 4,580,111 which is assigned to the same assignee as the present invention, the disclosure of which is herein incorporated by reference.

Figure 1:
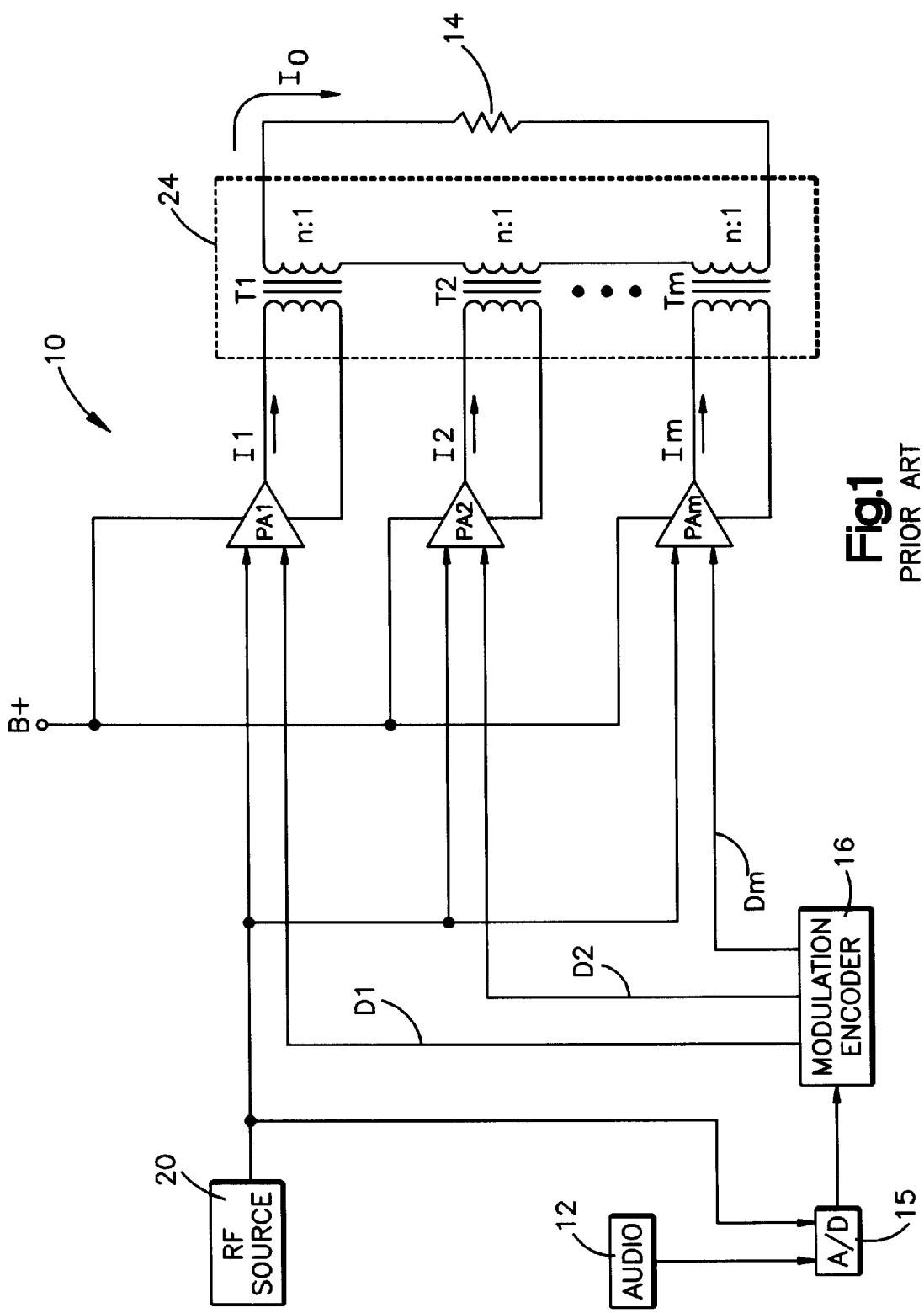
FIG. 1 is a prior art schematic-block diagram illustration of one application to which the present invention may be applied.

Referring now to FIG. 1, the amplitude modulator 10 is illustrated as receiving an input signal from input source 12, which may be the source of an audio signal. Modulator 10 amplitude modulates an RF carrier signal with the input signal. The modulation is a function of the amplitude of the input signal. The amplitude modulated carrier signal is provided on an output line connected to a load 14, which may take the form of an RF transmitting antenna. A modulation encoder 16 provides a plurality of digital control signals D1 through DM. The control signals are binary signals each having a binary 1 or a binary 0 level. The number of signals having binary 1 or binary 0 levels is dependent upon the instantaneous level of the input signal which is digitized by an analog to digital converter 15.

Each of the output control signals D1-DM is supplied to one of a plurality of M RF power amplifier modules $PA_1$-$PA_M$. The control signals serve to turn associated power amplifier modules either on or off. Thus, if the control signal has a binary 0 level, then its associated amplifier module is inactive and no signal is provided at its output. However, if the control signal is of a binary 1 level, then the power amplifier module is active and an amplified carrier signal is provided at its output. Each power amplifier module has an input connected to the single common RF source 20 so that each amplifier module $PA_1$-$PA_M$, when on, receives a signal of like amplitude and phase and frequency. The carrier signals may be square waves. The outputs of the power amplifier modules are supplied to a combiner circuit 24 comprised of a plurality of transformers $T_1, T_2, \ldots, T_M$. The secondary windings act as an independent signal source, whereby the signals provided by the various transformers additively combine with one another to produce a combined signal which is supplied to the load 14. This combined signal has the same frequency as the RF signal supplied by the RF source 20, but the amplitude of the combined signal is modulated in accordance with the input signal supplied by the input source 12.

While the transmitter is operating, some of the power amplifier modules PA1-PAM are turned on. This is represented in FIG. 1 wherein the currents I1, I2-IM are flowing in the primary windings of toroid transformers T1, T2 . . . TM. Current flowing in the primary windings causes current to be induced in the secondary windings providing a combined output current $I_o$ that flows through the load 14. This output current can be defined as the sum of the secondary currents as $$I_o=n(I1+I2+\ldots+IM) \quad \text{Equation 1}$$

Where Io is the output current, n equals the number of turns of each primary winding and M equals the number of amplifier modules.

If all of the amplifiers are equally weighted, then $I_p$=I1= I2=Im. Accordingly, equation 1 can be simplified as follows:

$$I_o=nmI_p \quad \text{Equation 2}$$

Where:

$$V_P=I_o.n.R \quad \text{Equation 3}$$

Where $I_o$ is the combiner secondary current R equals the primary terminated resistance $V_P$=primary voltage If one of the amplifier modules (such as PA1) is suddenly removed (by disconnecting the amplifier from the primary windings on transformer T1) while the current $I_o$ is flowing in the secondary windings of the combiner, a very high voltage potential $V_X$ will be developed across the open terminals the transformer. The voltage $V_x$ developed at the open transformer can be calculated as:

$$V_X=n(m-1)I_pR \quad \text{Equation 4}$$

Where:

$I_p$—primary current

If an open circuit is present, and R is equal to infinity, then the primary toroid voltage potential is also equal to infinity. This will cause damage to the transformer and other associated circuitry that comes in contact with this high voltage.

Figure 2:
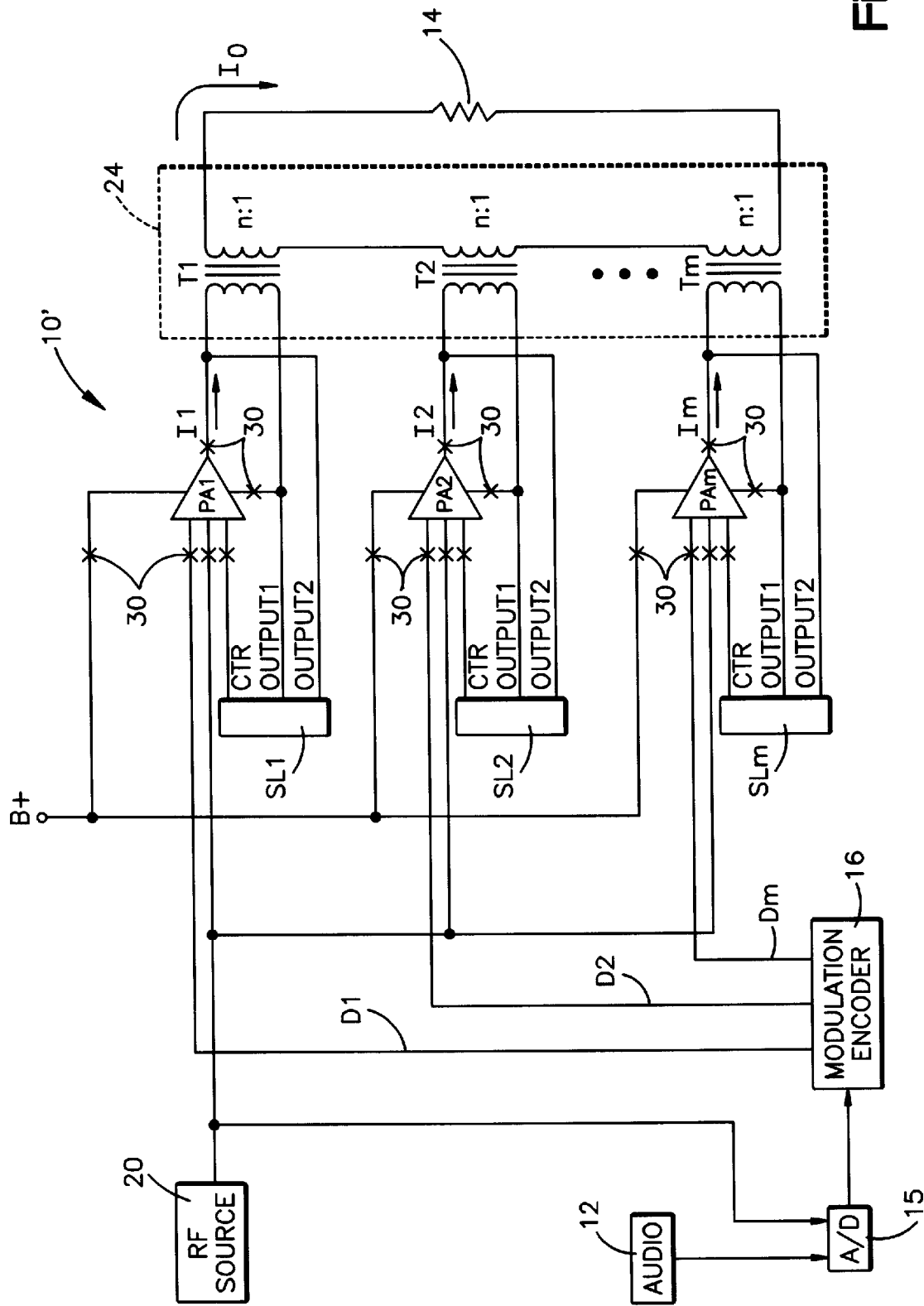
FIG. 2 is a schematic-block diagram illustration similar to that of FIG. 1, but employing connectors which are adapted to be connected to the circuitry of FIG. 3.

Reference is now made to FIG. 2 which incorporates the invention herein. The circuitry in FIG. 2 is similar to that as shown in FIG. 1 and, accordingly, like components are identified with like character references and only the differences between the circuitry in FIGS. 1 and 2 will be described in detail below.

Figure 3:
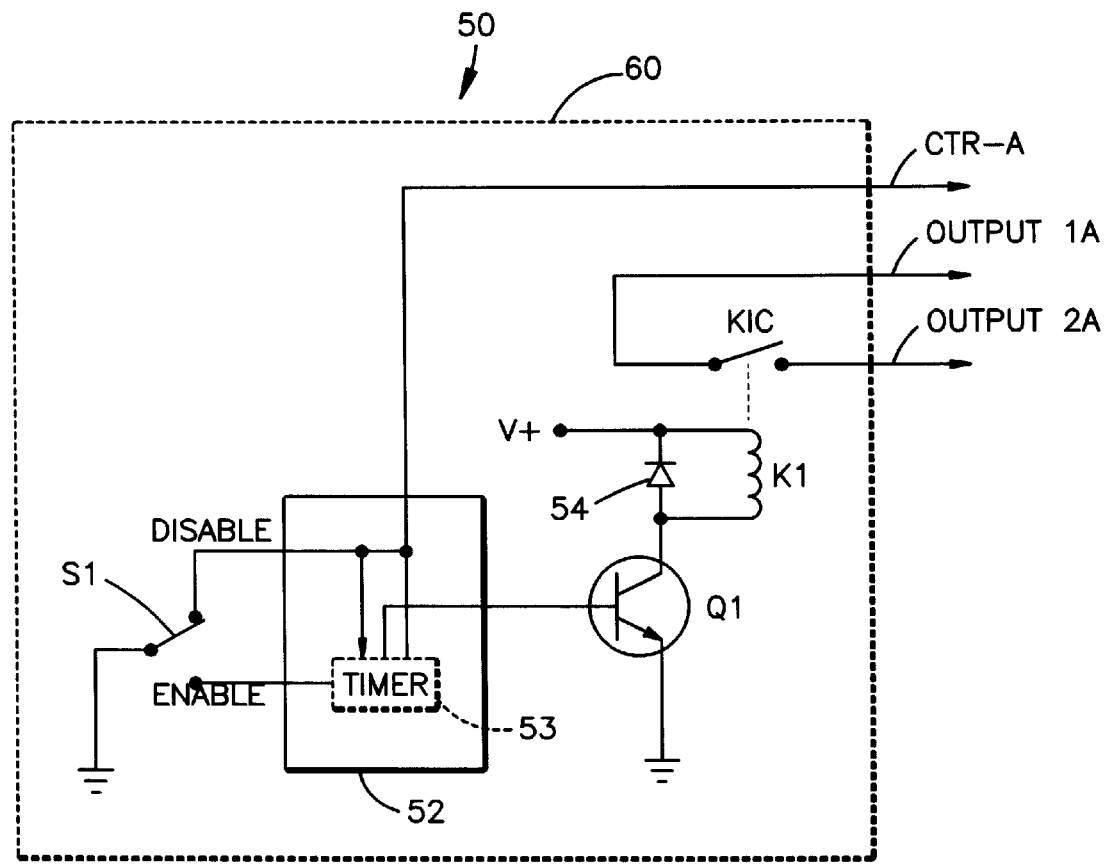
FIG. 3 is a schematic-block diagram illustration of the hot swapping key module apparatus of the present invention; and, FIG. 4 is a schematic-block diagram illustration of a power amplifier module used in the embodiment in FIG. 2.

This embodiment of the invention, as illustrated in FIGS. 2 and 3, permits an amplifier module to be disconnected and replaced while the transmitter is running without output disruption. As shown in FIG. 2, a modulator 101 is similar to that in the embodiment illustrated in FIG. 1 but additionally includes circuit connectors SL1, SL2 and SLM. Each of these connectors is constructed in the same manner. Thus, for example, each connector, such as SL1, has a control line CTR that extends into the power amplifier module PA1. The module includes a circuit (see FIG. 4) that responds to an enable signal from control line CTR to enable the amplifier and also responds to a disable signal from the control line CTR to disable the amplifier. A second line from the connector SL1 is referred to as output 1 and this is connected to one terminal on the primary winding of transformer T1. A second line is referred to as output 2 and is connected to the other terminal of the primary winding on transformer T1. Break points, such as break points 30, about each of the power amplifier modules represents various break points or connector points permitting the module to be plugged in or unplugged from a panel cabinet that normally carries the power amplifier module. Normally, such removable power amplifier modules are removed and replaced only when the transmitter is turned off and is not operating. As will brought out hereinbelow, the power amplifier module may be removed while the transmitter is operating.

Reference is now made to FIG. 3 which discloses the apparatus that is to be plugged into connector SL1 during disconnecting or replacement of a power amplifier module while the transmitter is operating. This apparatus includes a two position toggle switch S1 having a disable position and an enable position. When the apparatus 50 of FIG. 3 is plugged into a connector, such as connector SL1, a control line CTR-A makes electrical contact with the control line CTR extending from the connector SL1. Similarly, the output-1A from apparatus 50 makes contact through the connector SL1 with the output line referred to as OUTPUT 1 from connector SL1. Also the line output-2A from apparatus 50 makes electrical contact by way of connector SL1 to an output line from the connector referred to as OUTPUT 2. Normally, switch S1 is in the enable position and an open circuit exists between output lines 1A and 2A of apparatus 50.

Upon actuating the switch S1 from the enable position to the disable position, a ground signal is supplied on the control line CTR-A to the power amplifier module PA-1 (see AND gate 64 in FIG. 4) causing the power amplifier module to be disabled. After a short time delay (a few milliseconds), a timer 53 in the controller 52 provides a positive pulse to turn on a transistor Q1 energizing the coil of a relay K1. This causes the relay contacts K1C to close, providing a short circuit across the terminals 1A and 2A of apparatus 50. Since these terminals 1A and 2A are connected across the output lines 1 and 2 of the connector SL1, a short circuit is placed across the primary winding of transformer T1. The relay contacts K1C exhibit a low capacitance and low dissipation. The transistor Q1 together with the relay coil K1 are employed as a driver for the shorting switch relay contacts. A diode 54 is connected across the coil of the relay K1. The timer 53 in the control circuit may take any suitable form and provides a turn on pulse for tuning the transistor Q1 on after a time delay, a few milliseconds, after the switch S1 has been placed in the disable position.

Since the primary winding of the transformer T1 associated with the selected power amplifier module PA-1 is to be disconnected is now shorted, the power amplifier module can be disconnected from the system by removing the it from the cabinet by disconnecting at the break points 30. The amplifier may now be serviced and/or replaced with another power amplifier module while the transmitter continues to operate. Thus, servicing has been provided by the apparatus 50 so that the amplifier module may be removed for service without shutting down the transmitter.

The connectors SL1, SL2 . . . SLM, may be mounted on the face of a cabinet panel adjacent the associated power amplifier module. Alternatively, a slot may be provided in the panel near the associated power amplifier module and the connector may be located in the slot. In this case, the apparatus 50 may be mounted on a suitable support 60, such as a plastic card or the like, with the terminals CTR-1A and 2A extending beyond one edge of the card. The card may be inserted into the slot with the terminals making proper engagement with the output lines which extend from the connector to the associated power amplifier module.

To install a new or repaired amplifier module, the following procedure applies. The new amplifier module is installed into the location from which the disconnected amplifier module was removed with the new amplifier module properly connected at the breaker points 30 (FIG. 2). Switch S1 is then placed in the enable position. This removes the disable or ground signal from the control line CTR-A. The controller also responds to this enable signal by turning the transistor Q1 off. The relay K1 is de-energized. After a short time delay, on the order of milliseconds, the timer 53 provides a reset signal to the RF amplifier module by control line CTR-A so that the amplifier module PA-1 is now back online. The apparatus 50 is now removed from the connector SL1.

Figure 4:
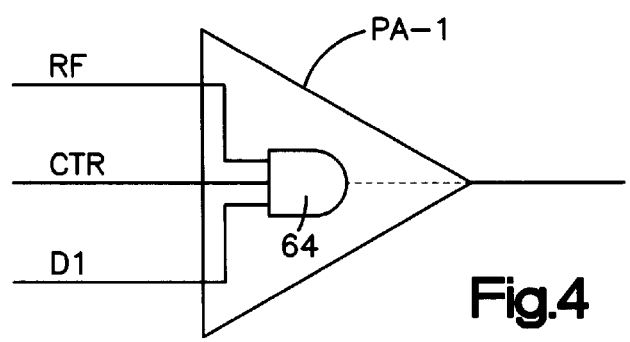

The power amplifier module PA-1 employs logic circuitry for responding to the control signal on the control line CTR to either inhibit the operation of the amplifier module or enable the operation of the amplifier module. This may be represented by an AND gate 64 as shown in FIG. 4. Whenever the switch S1 is placed in the disable condition a ground or binary "0" signal is placed on the control line CTR-A and this disables the AND gate. Whenever the switch S1 is returned to the enable position, the timer 53 times a slight delay and then applies a positive or enabling signal to the AND gate. The gate will pass the RF pulses so long as an amplifier turn on signal on line D1 has been received from the modulation encoder 16.

The hot swapping module apparatus 50 allows removal of an amplifier module while the transmitter is operating. This is an important feature so that an operator may repair a disconnected amplifier module while the transmitter is operating. Only one swapping circuit module is needed for a transmitter. This module may be moved to any amplifier module location to short out the transformer primary to assist in the removal of an amplifier module.

Although the invention has been described in conjunction with a preferred embodiment, it is to be appreciated that various modifications may be made without departing from the spirit and scope of the invention as defined by the appended claims.

Having described the invention we claim:

1. Apparatus for use in disconnecting or replacing one of a plurality of M power amplifier modules in an RF transmitter while the transmitter is operating and wherein each said amplifier module has first and second outputs normally connected across an associated one of M primary windings located on at least one transformer and wherein M secondary windings are provided with said secondary windings being connected together in series across a load; each said amplifier module having a turn on-turn off input for receiving either a turn on signal or not turn on signal for respectively turning on or turning off said module; and an input signal encoder for providing said turn on signals to various of said turn on-turn off inputs of said M power amplifier modules; and each said amplifier module having a control input for receiving a disable signal that disables the amplifier module; said apparatus comprising:

a switch having a disable condition and an enable condition;

a controller responsive to said switch being in a disable condition for providing a disable signal;

a shorting switch having a normal open condition and a shorting condition and wherein said switch is connectable across the said primary winding of an associated said amplifier module to be disconnected; and a shorting switch driver responds to said disable signal for driving said shorting switch to its shorting condition to thereby short circuit the primary winding associated with said amplifier module that is to be disconnected from said transmitter.

2. Apparatus for use in disconnecting or replacing one of a plurality of M power amplifier modules in an RF transmitter while the transmitter is operating and wherein each said amplifier module has first and second outputs normally connected across an associated one of M primary windings located on at least one transformer and wherein M secondary windings are provided with said secondary windings being connected together in series across a load; and each said amplifier module having a control input for receiving a disable signal that disables the amplifier module; said apparatus comprising:

a switch having a disable condition and an enable condition;

a controller responsive to said switch being in a disable condition for providing a disable signal;

a shorting switch having a normal open condition and a shorting condition and wherein said switch is connectable across the said primary winding of an associated said amplifier module to be disconnected;

a shorting switch driver responds to said disable signal for driving said shorting switch to its shorting condition to thereby short circuit the primary winding associated with said amplifier module that is to be disconnected from said transmitter; and, said switch is manually operable between said disable condition and said enable condition.

3. Apparatus as set forth in claim 1 wherein said controller provides said disable signal after said switch is initially placed into said disable condition.

4. Apparatus for use in disconnecting or replacing one of a plurality of M power amplifier modules in an RF transmitter while the transmitter is operating and wherein each said amplifier module has first and second outputs normally connected across an associated one of M primary windings located on at least one transformer and wherein M secondary windings are provided with said secondary windings being connected together in series across a load; and each said amplifier module having a control input for receiving a disable signal that disables the amplifier module; said apparatus comprising:

a switch having a disable condition and an enable condition;

a controller responsive to said switch being in a disable condition for providing a disable signal;

a shorting switch having a normal open condition and a shorting condition and wherein said switch is connectable across the said primary winding of an associated said amplifier module to be disconnected;

a shorting switch driver responds to said disable signal for driving said shorting switch to its shorting condition to thereby short circuit the primary winding associated with said amplifier module that is to be disconnected from said transmitter; and, said controller includes a timer that supplies said disable signal after a time delay following the initial placement of said switch in said disable condition.

5. Apparatus as set forth in claim 4 wherein said switch is manually operable.

6. Apparatus as set forth in claim 1 wherein said shorting switch driver includes a transistor which, when on, initiates and continues the placing of said shorting switch in its shorting condition.

7. Apparatus for use in disconnecting or replacing one of a plurality of M power amplifier modules in an RF transmitter while the transmitter is operating and wherein each said amplifier module has first and second outputs normally connected across an associated one of M primary windings located on at least one transformer and wherein M secondary windings are provided with said secondary windings being connected together in series across a load; and each said amplifier module having a control input for receiving a disable signal that disables the amplifier module; said apparatus comprising:

a switch having a disable condition and an enable condition;

a controller responsive to said switch being in a disable condition for providing a disable signal;

a shorting switch having a normal open condition and a shorting condition and wherein said switch is connectable across the said primary winding of an associated said amplifier module to be disconnected;

a shorting switch driver responds to said disable signal for driving said shorting switch to its shorting condition to thereby short circuit the primary winding associated with said amplifier module that is to be disconnected from said transmitter;

said shorting switch driver includes a transistor which, when on, initiates and continues the placing of said shorting switch in its shorting condition; and, said switch is manually operable.

8. Apparatus as set forth in claim 7 wherein said controller includes a timer that supplies said disable signal after a time delay following the initial placement of said switch in said disable condition.

9. A method for disconnecting or replacing one of a plurality of M power amplifier modules in an RF transmitter while the transmitter is operating and wherein each said amplifier module has first and second outputs normally connected across an associated one of M primary windings located on at least one transformer and wherein M secondary windings are provided with said secondary windings being connected together in series across a load; each said amplifier module having a turn on-turn off input for receiving either a turn on signal or not turn on signal for respectively turning on or turning off said module; and an input signal encoder for providing said turn on signals to various of said turn on-turn off inputs of said M power amplifier modules; and each said amplifier module having a control input for receiving a disable signal that disables the amplifier module; said method comprising the steps of:

applying a disable signal to a said control input for disabling a said amplifier module;

thereafter short circuiting the primary winding associated with the disabled said amplifier module; and, thereafter disconnecting the disabled said amplifier module from said transmitter while said transmitter is operating.

* * * * *